(12) United States Patent
Skarupo

(10) Patent No.: US 6,438,025 B1
(45) Date of Patent: Aug. 20, 2002

(54) MAGNETIC MEMORY DEVICE

(76) Inventor: Sergei Skarupo, 1040 Sutter St., Apartment 44, San Francisco, CA (US) 94109

( * ) Notice: Subject to any disclaimer, the term of this patent is extended or adjusted under 35 U.S.C. 154(b) by 0 days.

(21) Appl. No.: 09/658,766

(22) Filed: Sep. 8, 2000

Related U.S. Application Data

(60) Provisional application No. 60/152,740, filed on Sep. 8, 1999.

(51) Int. Cl.[7] ................................................ G11C 7/00
(52) U.S. Cl. ........................... 365/158; 365/33; 365/63; 365/66; 365/97; 365/99; 365/171; 365/209; 365/225.5
(58) Field of Search ........................... 365/158, 33, 63, 365/66, 67, 97, 99, 171, 209, 225.5

(56) References Cited

U.S. PATENT DOCUMENTS

| | | | | |
|---|---|---|---|---|
| 4,455,626 A | * | 6/1984 | Lutes | 365/158 |
| 4,791,604 A | | 12/1988 | Lienau et al. | 365/9 |
| 4,881,143 A | * | 11/1989 | Bhattacharyya et al. | 360/113 |
| 5,776,537 A | * | 7/1998 | Ryan et al. | 427/8 |
| 6,074,743 A | * | 6/2000 | Araki et al. | 428/332 |
| 6,088,181 A | * | 7/2000 | Tanaka | 360/66 |
| 6,111,406 A | * | 8/2000 | Garfunkel et al. | 324/210 |
| 6,111,782 A | * | 8/2000 | Sakakina et al. | 365/158 |
| 6,154,335 A | * | 11/2000 | Smith et al. | 360/75 |
| 6,157,510 A | * | 12/2000 | Schreck et al. | 360/77.06 |

OTHER PUBLICATIONS

Bertram, H. Neal, Theory of Magnetic Recording, Cambridge: Cambridge University Press, 1994, pp. 166–203, 230–241.

Mee, C. Denis, et al., Magnetic Recording Technology, vol. 1, First Edition, 1987, 66–87, 189–194, 216–219, 263, 275–283 pages.

Seeger, Karlheinz, Semiconductor Physics, An Introduction, Berlin: Springer–Verkag, 1985, pp. 46–51, 102–111, 114–131, 138–141, 144–145.

Brown, J.L., et al., "1–Mb Memory Chip Using Giant Magetoresistive Memory Cells", IEEE Transactions on Components, Packaging, and Manufacturing Technology, Part A, vol. 17, No. 3, Sep. 1194, pp. 373–379.

Atarashi, E., et al., "Recording Process and Reproducing Feasibility of Transverse Magnetic Recording", Journal of Applied Physics, vol. 86, No. 10, Nov. 15, 1999, pp. 5780–5787.

Dekker, Cees, "Carbon Nanotubes as Molecular Quantum Wires", Physics Today, May 1999, pp. 22–28.

Ebbesen, Thomas W., "Carbon Nanotubes", Physics Today, Jun. 1996, pp. 26–32.

Mee, C. Denis, et al., Magnetic Recording Technology, Second Edition, 1996, Table 4.2.

Mee, C.D., The Physics of Magnetic Recording, Elsevier Science Publishers B.V. 1964, 1986, pp. 76–81, 144–155, 158–159.

\* cited by examiner

*Primary Examiner*—Viet Q. Nguyen
(74) *Attorney, Agent, or Firm*—Fliesler Dubb Meyer & Lovejoy LLP

(57) ABSTRACT

The invention described herein defines a system and a method for selectively controlling the sensitivity of a region of a magnetoresistive element to an incident magnetic field, by applying an external magnetic field to the magnetoresistive element. A number of applications to non-volatile data storage are described, as is a magnetic sweep element based on a FET structure. Finally, the storage media and recording modes (in-plane vs. perpendicular) best suited to the proposed applications are analyzed, and the desired or optimal characteristics of the proposed devices are discussed.

45 Claims, 11 Drawing Sheets

MAGNETIC MEMORY DEVICE

CLAIM OF PRIORITY

This application claims the benefit of U.S. Provisional Application No. 60/152,740 filed Sep. 8, 1999.

FIELD OF THE INVENTION

The invention relates generally to magnetic recording devices and specifically to a system and a method for using a magnetoresistive head within an integrated magnetic memory device.

BACKGROUND OF THE INVENTION

The magnetoresistive sensors in use today are capable of spatial resolution only in the order of magnitude of their size. A typical sensor may be comprised of a single sensing element, or may comprise a large number of discrete sensing elements which are individually controlled and accessed by the system. The need to access the sensor elements individually poses limitations on the areal density in MRAM devices. In magnetoresistive (MR) heads, the trackwidth is ultimately determined by the length of the sensor element, which, for several reasons, cannot be reduced sufficiently to take full advantage of the modern magnetic storage media. Conventional magnetic memory recording techniques, devices, and sensors are discussed in the following references, hereby incorporated by reference:
1. H. Neal Bertram, Theory of Magnetic Recording, Cambridge: Cambridge University Press, 1994
2. Richard P. Feynman, Robert B. Leighton, Matthew Sands, The Feynman Lectures on Physics, vol.2, Moscow: Mir, 1966
3. M. I. Kaganov, V. M. Tsukernik, Priroda Magnetizma, Moscow: Nauka, 1982
4. John C. Mallinson, The Foundations of Magnetic Recording, San Diego: Academic Press, 1987
5. C. Denis Mee, Eric D. Daniel, Magnetic Recording Technology, McGraw-Hill, 1996
6. M. Prutton, Thin Ferromagnetic Films, Washington, Butterworths, 1964
7. Karlheinz Seeger, Semiconductor Physics, An Introduction, Berlin: Springer-Verlag, 1985
8. Ronald F. Soohoo, Magnetic Thin Films, New York: Harper & Row, 1965
9. R. S. Tebble, Magnetic Domains, London: Methuen, 1969
10. S. Tehrani, J. M. Slaughter, E. Chen, M. Durham, J. Chi, and M. DeHerrera, "Progress and Outlook for MRAM Technology", IEEE Trans. Magn., vol. 35, No. 5, p. 2814 (1999)
11. Hans Boeve, Christophe Bruynseraede, Jo Das, Kristof Dessein, Gustaaf Borghs, Jo De Boeck, "Technology assessment for the implementation of magnetoresistive elements with semiconductor components in magnetic random access memory (MRAM) architectures", IEEE Trans. Magn. 35 (5), 2820 (1999)
12. J. L. Brown, A. V. Pohm, "1-Mb Memory Chip Using Giant Magnetoresistive Memory Cells", IEEE Trans. Comp., Pack. & Man. Techn.—Part A, 17 (3), 373 (1994)
13. E. Atarashi and K. Shiiki, "Recording process and feasibility of transverse magnetic recording", J. Appl. Phys. 86 (10), 5780 (1999)
14. Sees Dekker, "Carbon Nanotubes as Molecular Quantum Wires", Physics Today, May 1999, p. 27

SUMMARY OF THE INVENTION

The invention addresses these goals. In one embodiment the invention includes a novel method of enhancing or suppressing the sensitivity of a part of magnetoresistive film area in a sensor by applying an external control field (to follow convention, we will use the term bias for a uniform external field, which is not applicable in this case). The response of the saturated part is significantly suppressed. Then, for example, expanding the saturated zone while monitoring the sensor response will allow us to scan the magnetization of the storage medium. The medium may be scanned with a single spot of saturation in the MR sensor film plane or, conversely, most of the film may be saturated, leaving one spot unaffected. In this manner no moving parts are necessary to perform the scan of the storage medium.

In another embodiment, the invention comprises a data storage device comprising: a magnetic storage medium; a magnetoresistive element; and, means, operatively coupled to said magnetoresistive element, for selectively controlling the sensitivity of a selected region of said magnetoresistive element to the magnetic field presented by the magnetic storage medium.

In a further embodiment, the invention comprises a data storage device comprising: a magnetic storage medium; a magnetoresistive element, the location of said magnetoresistive element being fixed relative to said magnetic storage medium; and, means, operatively coupled to said magnetoresistive element, for selectively controlling the sensitivity of a selected region of said magnetoresistive element to the magnetic field presented by a corresponding region of the magnetic storage medium wherein said corresponding region of the magnetic storage medium comprises a plurality of data storage locations.

In a further embodiment, the invention comprises a method for reading information stored on a magnetic storage medium with a magnetoresistive element, comprising the steps of: (a) altering the sensitivity of a selected region within the magnetoresistive element to an incident magnetic field; and, (b) reading information stored on the magnetic storage medium by sensing the effect of the incident magnetic field on the selected region of the magnetoresistive element.

DETAILED DESCRIPTION OF THE PREFERRED EMBODIMENT

I. Introduction

An embodiment of the invention employs a method of enhancing or suppressing the sensitivity of a part of magnetoresistive element by applying an external control field (to follow convention, the term bias will be used only for a uniform external field, which is not applicable in this case). The response of the selected part is significantly suppressed (or in some embodiment enhanced) In an idealized scenario, the desensitized zone may be created by saturating the magneto-sensitive element or film in a selected region. Then, for example, expanding the saturated zone while monitoring the sensor response allows the system to scan the magnetization of the storage medium. The medium may be scanned with a single spot of saturation in MR sensor film plane or, conversely, most of the film can be saturated, leaving one spot unaffected. In this manner no moving parts are necessary to perform the scan.

It will be evident to one skilled in the art that this method may be used for a magnetoresistive head design, greatly increasing the readout speed and narrowing the effective trackwidth. For example the invention could be used in combination with a traditional design whereby the head is moved relative to the storage medium, such as a disk system. Incorporating the invention in this way would increase the effective resolution of the device, and the flexibility of the design. However, in this discussion of a specific embodiment, we will concentrate on an integrated MRAM device.

Importantly, by producing stronger control fields while using the same apparatus, data may be recorded, similarly to the way it's done in existing MRAM devices and in magnetooptical drives, which employ a low intensity laser beam for read operations and high intensity beam for write operations.

In conventional MRAM devices that use stacked GMR cells [10]–[12], the sense line and the storage medium are integrated into the digit line, and the readout is essentially based on reversible changes in the medium. While this approach is superior to those requiring independent access to each memory cell, the number of cells per stack is still very limited.

II. Sensor Operation
A. General Considerations

Figure 1:
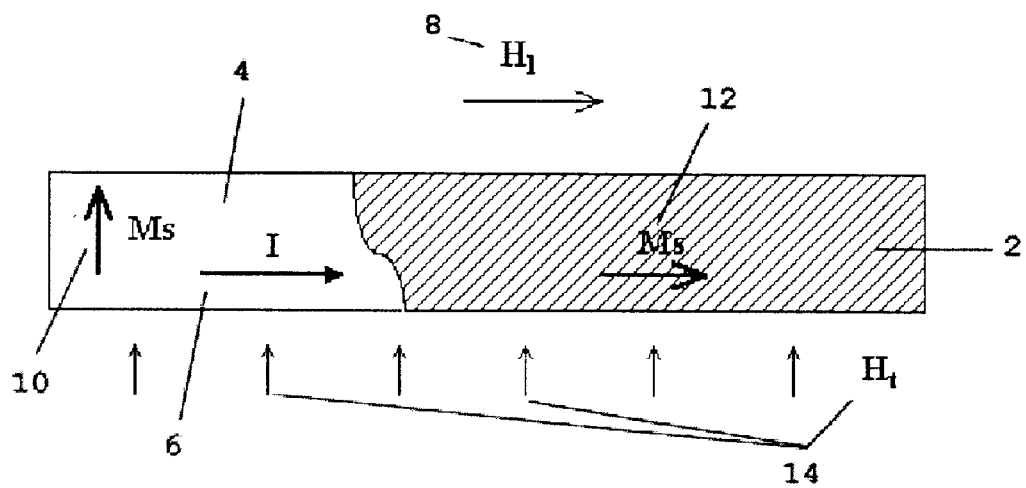
FIG. 1 is a schematic of a controlled magnetoresistive film sensor as embodied in the invention.

The sensor itself does not require the control field to have any specific orientation. Disregarding anisotropy and hysteresis, the strength of the saturating field must be N·Ms, where N is the corresponding component of the demagnetization tensor, Ms is the saturation magnetization. For the direction perpendicular to the film plane N≈1, i.e. the field must have a relatively high intensity and thus may erase the data. In the film plane N<<1. For an infinitely large area or infinitely thin film N=0. The demagnetizing field of the medium will also turn the magnetization vector in film plane. This discussion of the preferred embodiment concentrates on a design in which the saturating control field is directed along the easy axis, as shown in FIG. 1, although it will be evident to one skilled in the art that alternative designs may be used while remaining within the spirit of the invention. FIG. 1 shows an illustration of a controlled magnetoresistive film sensor. In this embodiment the shaded area 2 is saturated (suppressed sensitivity), whereas the unshaded area 4 is of normal sensitivity. As shown in FIG. 1, the individual components may be represented as: I—current in sensor 6, Ms—magnetization vector 10,12, Hl—external, longitudinal magnetic field 8, or control field, Ht—transverse component of medium demagnetization field, or desired signal 14.

The general formula describing magnetoresistance may be given as:

$$\Delta R = \left(\frac{\Delta \rho}{\rho}\right) \cdot R \cdot (\cos(\theta))^2$$

where is angle between vectors Ms and I, R—resistance at θ=0, Δρ/ρ magnetoresistive coefficient.

Figure 2:
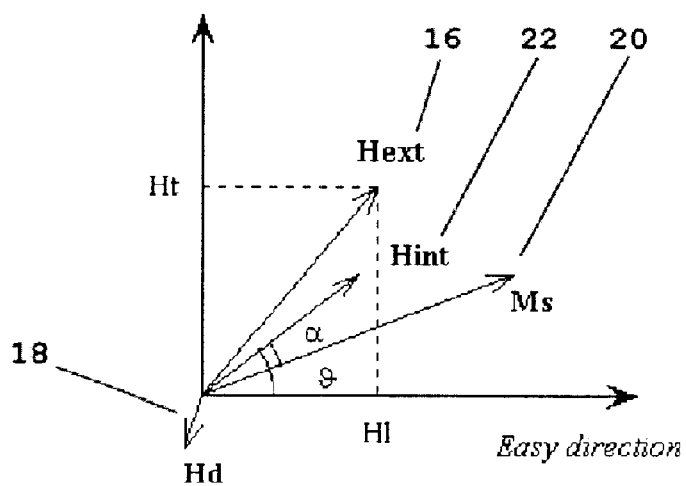
FIG. 2 is a graph of a magnetic field in a uniaxially anisotropic medium.

As shown in FIG. 2, Hext represents the external field 16, Hd—self-demagnetizing field 18, Ms—magnetization 20, and Hint—total internal field 22. FIG. 2 shows the components of magnetic field in a uniaxially anisotropic medium. In our case, the resulting external field vector is directed at an angle to the easy axis. Due to the effect of anisotropy and self-demagnetizing fields, Ms is not necessarily parallel to Hext.

Considering the case where an anisotropic magnetoresistive (AMR) sensor is partially saturated along the easy axis by an external control field of known strength, the easy axis typically lies in the film plane.

For simplicity of calculations, the film plane is assumed to be infinite. Since the film plane is assumed to be infinite, the in-plane components of the demagnetization tensor equal zero, therefore Hd=0, Hint=Hext−Hd=Hext. The specific potential energy of magnetic field Em=−Ms·H·cos α. It is minimal when Ms and H are parallel. The specific anisotropy energy Ea=−K·(Ms·cos θ)², where K is the anisotropy constant, or Ea=−Hk·Ms·cos ²θ, where Hk is the anisotropy field. Ea is minimal when Ms is directed along the easy magnetization axis, assuming that K>0. Full potential energy E=Em+Ea=−Ms·(H·cos α+Hk·cos ²θ). The multiplier cos ²θ is known from the sensor response. The longitudinal component Hl is also known since this is the control field in our case.

In this simplified example, finding the energy minimum will yield only one solution for |Ht|. Thus it can be demonstrated that the transverse component can be uniquely determined from the sensor response.

The magnetoresistance formula, as applied to controlled MR sensor may be written:

$$\Delta R = \left(\frac{\Delta S}{S}\right) \cdot \left(\frac{\Delta \rho}{\rho}\right) \cdot R \cdot (\cos(\theta))^2 \quad (1)$$

where $\Delta S$—area representing 1 bit of data, S—sensor area. The sensor plane may be of any shape, and $\Delta S$ may be located anywhere in it.

If necessary, a uniform external transverse bias field can be applied to obtain $\theta=45°$ in absence of a recorded signal, as is done in conventional magnetoresistive heads.

The total resistance for any shape and film thickness can be optimized by, for example, etching microscopic openings in the film. In one embodiment, a square sensor may be separated into N sequential strips by etching a zigzag shaped opening, and has a resistance $R=\rho \cdot N^2/\sigma$, where $\rho$ is resistivity and $\sigma$ is film thickness.

One common obstacle towards applying magnetoresistive sensors to practical use is Barkhausen noise, which is caused by irreversible jumps of the domain walls. In magnetoresistive heads this problem is traditionally controlled by promoting the formation of a single domain in the magnetoresistive strip, for example by increasing length to width ratio and/or applying a longitudinal bias. However, the length of the magnetoresistive strip is usually restricted by the trackwidth, which is quite narrow. There is no such restriction in the design utilized by the invention.

Generally, large domains with in-plane magnetization are formed in thin magnetic films, unless there is strong perpendicular anisotropy. This results from the fact that high energy is needed to form a domain wall in thin film, and energy of in-plane oriented domains is relatively low. In-depth analysis of thin permalloy films can be found in [6], [8]. In this case, it is convenient to physically separate the film into narrow strips to form a single domain in each one. In practice, because of imperfections, stray domain walls may form near the edges. In any case, Barkhausen noise in magnetoresistive heads has received much study and there are known methods of suppressing it.

Eddy currents in the MR sensor are not likely to be an obstacle, even if it will not be separated into strips, since inductive heads with thin film cores are known to successfully operate at frequencies over 10 MHz [5].

B. Theoretical Limits of Sensor Resolution

Throughout the scope of this discussion, the term "resolution" as applied to controlled MR sensors will represent the maximum number of bits per sensor element. From the considerations stated above, the main limitation to obtaining high resolution in controlled MR sensors is Johnson's noise. This is also expected to be the main limitation for conventional MR heads in the near future [1].

Johnson's formula for noise voltage of a resistor can be written:

$$V_{noise} = \sqrt{4 \cdot K \cdot T \cdot \Delta f \cdot R}$$

where T is absolute temperature, K—Botzmann's constant, $\Delta f$—frequency band. Therefore, resolution limited by noise is $$\frac{S}{\Delta S} = \frac{1}{SNR} \cdot \frac{\Delta \rho}{\rho} \cdot (\cos(\theta))^2 \cdot \sqrt{\frac{P}{4 \cdot K \cdot T \cdot \Delta f}} \quad (2)$$

where SNR is the lowest acceptable signal to noise ratio, by voltage, and P is power dissipated in the magnetoresistive material.

For example, at maximum modulation ($\theta=45°\pm45°$), 2% MR coefficient, 10 w power, 10 MHz band, 300K temperature, and SNR=20 dB, the resolution of one such element will be about 7500.

In other embodiments of the invention, multilayer GMR structures may be used, where $\Delta \rho/\rho$ may be as high as 20%.

C. Required Strength of Control Field, Demagnetizing Fields, Feasibility of Non-Destructive Readout We now consider the sensor-medium interaction. In order to turn the magnetization vector in the MR film, the external field must overcome both demagnetization and anisotropy fields. For example, according to [1], the transverse magnetostatic field of 200 Å thick 1 $\mu$m wide strip of permalloy with 800 kA/m saturation magnetization, away from the edges, is 6.4 kA/m. The anisotropy field is about an order of magnitude lower than that. Therefore, it may be beneficial to use such materials as NiFeCo alloy, in which Hk≈0.7 kA/m and MR coefficient≈4 ... 5%.

The demagnetizing field of the medium, or "fringing field", which is in effect the desired signal, depends on such factors as the spacing between sensor and medium, the orientation and thickness of the medium, and the recorded wavelength. In conventional magnetic recording it is about two orders of magnitude lower than remanent magnetization of the medium. For example, if Mr=500 kA/m, the demagnetizing field will be in the order of 5 kA/m, which should be more than sufficient to modulate the sensor and produce a signal.

The external field should preferably have a well defined border and be stronger than that of the medium (5 kA/m in this estimate), but not so strong as to erase the recorded data. One possible configuration is described below. Digital recording will not suffer as long as the external field is significantly weaker than the coercive force of the medium, which is at least in the order of tens of kA/m in most storage media. This leaves a margin of one order of magnitude.

As illustrated in the examples above, the transverse demagnetizing field of the sensor is too week to erase the recording. A close numerical result can be obtained by applying the reciprocity principle: in the plane of the medium, the demagnetizing field created by the MR sensor will be weakened by the same factor as that of the medium in the plane of the sensor, not accounting for the superposition of recorded signals. The factor of two orders of magnitude yields 8 kA/m stray demagnetizing field.

It should be noted that in this design as shown in (FIG. 1) the external field is directed along the MR strip. The longitudinal component of the demagnetization tensor can be considered to be equal to zero for all practical purposes (and in any case the stray demagnetizing field would oppose the external field).

Thus, the MR film is sensitive enough and neither the external saturating field nor the sensor demagnetizing field are strong enough to erase the recorded data. All these calculations can be done more thoroughly for specific materials and requirements.

D. Coincident Current Scheme

The coincident current scheme has been traditionally implemented in a wide variety of devices, starting with magnetic core memory down to modem MRAM. The method is simple—for both read and write operations, the currents in the orthogonal word and bit lines are matched so as to affect only the magnetization of a single core or cell at the intersection. When using parallel I/O a number of bit lines are used simultaneously. Complicated designs to make non-destructive readout possible have been suggested in the past [8]. Some of them are based on detecting reversible magnetization changes. Modern pseudo spin valve devices also use this principle of non-destructive readout.

The proposed readout method of an embodiment of the invention is intrinsically non-destructive and does not rely on magnetization changes in the storage medium. It may be implemented with the conventional coincident current scheme described above, but other structures and schemes may also be used.

E. Sweep vs. Conventional Coincident Current Scheme

Generally, it is not necessary to switch individual wires to operate the invention. One embodiment of the invention works by controlling a border of a conductive zone. If we consider an array of magnetic storage elements M, in order to switch one element M [i, j], with the conventional coincident design, the current would be switched on in wires i and j. If the currents in wires 0 . . . j, 0 . . . i are switched on, all elements in array i×j will be magnetized. However, in a novel aspect of the invention, if the conductive zones are not separated into individual wires, the perpendicular component again will only affect one element [i,j].

Further, longitudinal recording is possible by gradually shrinking the magnetized area i×j and switching the direction of the write current. Using this method the data must be recorded sequentially, for example as a block or a stack.

With this approach, a single sweep device can be used instead of switching circuitry controlling individual wires. However, due to the limited resolution of a single controlled MR sensor, a hybrid design may be the best solution. In one embodiment of a hybrid sensor the word lines can be replaced with a sweep device., while the bit lines continue to be accessed by discrete MR strips or wires. The same electronic circuitry can control the power in both the bit lines and the MR sensors.

Parallel read and write operations are also possible. Parallel write is achieved by using any chosen number of bit lines simultaneously. Concerning the readout, if we let c be the number of simultaneously operating channels; then full bandwidth=c·Δf, full power=c·P, and longitudinal resolution remains proportional to √(P/AΔf). Therefore, any convenient number of channels may be chosen without affecting the recording density, total power consumption, or readout data rate. Generally, one amplifier per channel is needed. The higher the number of channels, the lower the bandwidth and therefore the lower the SNR requirements for each amplifier.

It will be evident to one of skill in the art that the total number of MR sensor strips can be orders of magnitude higher than the number of channels, as long as the power in unused strips is switched off by the controlling circuitry. This is preferable anyway, in order to lower the power consumption.

III. Sweep FET

A. Proposed Designs

Figure 3:
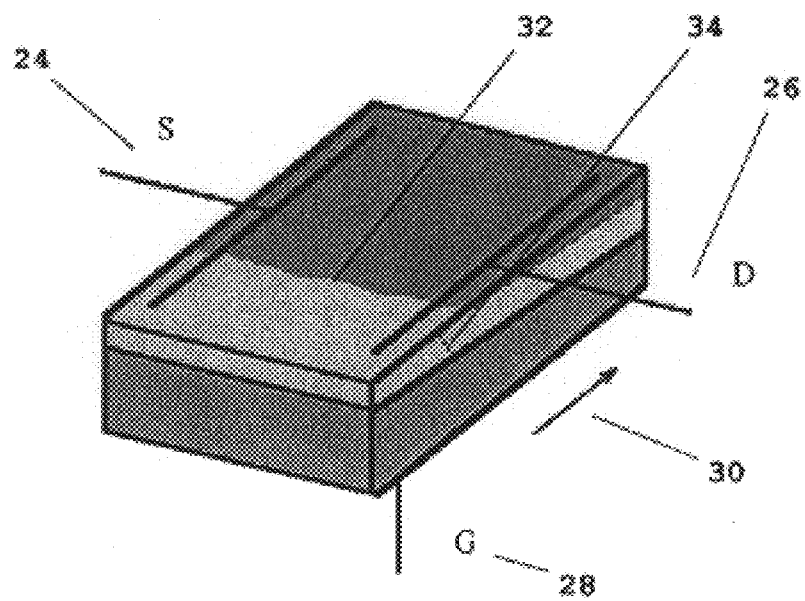
FIG. 3 is an isometric view of a FET in accordance with the present invention illustrating how the depletion zone boundary in a FET device is inclined at an angle with respect to the outer surface.

Several possible designs exist which embody the principle of the invention, specifically the method in which a zone of saturation is created in the MR film. In one embodiment a sweep device can be built utilizing the variable depletion zone of a field effect transistor. It may be preferable to use a FET (field effect transistor) to produce the field by controlling the currents in a thin conductive film separated into nanowires rather than directly; otherwise, the power consumption may be too high and/or resolution too low. An example of a FET device for use with an embodiment of the invention is shown in FIG. 3 including Source 24, Drain D 26 and Gate G 28.

The depth of the depletion zone 32 can be controlled by varying the gate voltage. In conventional FETs, when a cut-off voltage is applied to the gate, the depletion zone reaches the surface, completely closing the current path between source and drain electrodes.

Such structures as p-n junction FET's and MESFET's seem ideally suited to serving this purpose.

To estimate the depth of the depletion zone, we will use Schottky's formula [7]. In a direction perpendicular to the junction plane, the second derivative of the electric potential is proportional to the free charge density, i.e. the doping concentration. This is expressed in a form of Poisson's equation, which is solved in one dimension. The solution for depletion zone depth is:

$$-Na \cdot Yp = Nd \cdot Yn$$

$$|Yn - Yp| = \sqrt{\frac{2 \cdot \varepsilon \cdot \varepsilon 0}{|Qe|} \cdot (Nd^{-1} - Na^{-1}) \cdot (Vd + Vb)}$$

The border between p- and n-regions lies at y=0. It is considered to be absolutely sharp. Yn—depletion zone depth in the n-region, Yp—same, in p-region, ∈—relative permittivity of the semiconductor material, Vd—diffusion voltage, Vb—reverse bias, Nd—donor concentration (n-region), Na—acceptor concentration (p-region), Qe—electron charge.

Usually, the doping concentrations in p- and n-regions are very different. For example, let Na<<Nd. Then the depth of the depletion zone in p-region is:

$$Yp = \sqrt{\frac{2 \cdot \varepsilon \cdot \varepsilon 0}{|Qe|} \cdot \frac{1}{Na} \cdot (Vd + Vb)} \quad (3)$$

The formula for the depletion zone depth in a MESFET is similar to this one.

To illustrate by way of example, in Si p-n junction with normal doping concentrations and gate voltage 0–10 V, the depletion zone in the region of smaller concentration can be varied by roughly 50 μm.

The lighter doped channel region is higher in resistivity, which means higher power dissipation. The doping could be increased at the expense of the depletion zone depth. GaAs may be a better material choice for this device than Si.

A number of methods exist to better control the boundary at the surface, including combinations of one or more of the following:

(1) The lateral face of FET channel can be used as the working surface (in which case the depletion zone boundary is at the right angle to the outer surface). With this system the sweep region will be only as wide as the depletion zone may be varied, which serves to limit the capabilities of the device.

(2) In order to widen the sweep zone, the outer surface of the channel can be physically slanted at an acute angle 34 with respect to the junction, as shown in FIG. 3.

(3) A similar effect can be achieved by gradually changing the doping concentration along the desired direction of movement of depletion zone boundary 32 (as indicated by the arrow 30 in FIG. 3). Thus the inclination of the depletion zone boundary with respect to the outer zone can be made as small as desired. See FIG. 4 and also formula (4) below.

(4) The depletion zone can be slanted by applying voltage across the MESFET gate electrode (along the arrow in FIG. 3) or by using separate gates. This is precisely what happens in conventional FET's: the depletion zone is asymmetrical because of the different gate-source and gate-drain voltages. This design is easiest to implement, especially with MESFET structure, in which the gate is made of thin metal film.

Figure 4:
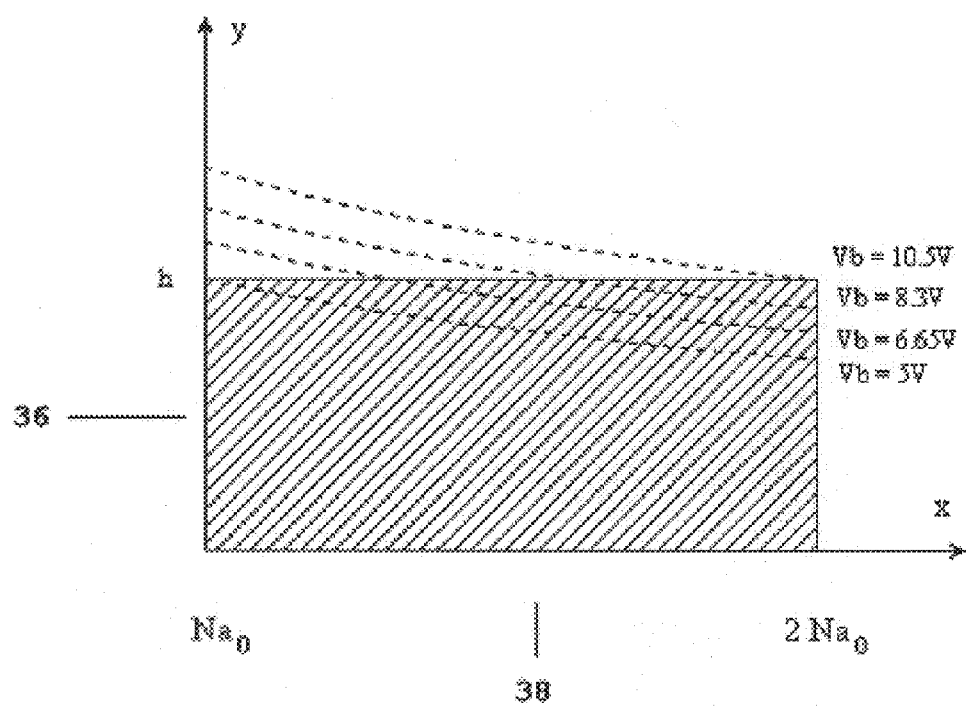
FIG. 4 is a graph illustrating an example of variable doping concentration and depletion zone boundary at different gate voltages.

For variable doping concentration, as example of which is illustrated in FIG. 4, the effective inclination angle is:

$$\alpha = \tan^{-1}\left[\frac{1}{4} \cdot k \cdot |Qe| \cdot \frac{h^3}{\varepsilon \cdot \varepsilon 0 \cdot (Vd + Vb)}\right] \quad (4)$$

Where h represents height of channel 36, k—rate of change of doping concentration (in a lightly doped region) 38. FIG. 4 shows an example of variable doping concentration, depletion zone boundary at different gate voltages. Diffusion voltage=0.5 V, doping concentration doubles from left to right. All parameters are chosen only for visual clarity As mentioned above, the conductive film may be separated into nanowires. The necessary density can be achieved by using a photolithographic or similar manufacturing process. If nanowires are used the current will have a well-defined border, and there will be no eddy currents to consider. For calculations, an array of nanowires can be considered a solid film.

If necessary, one embodiment of the invention envisages that the nanowires may be diverged to increase the sweep zone.

Figure 5:
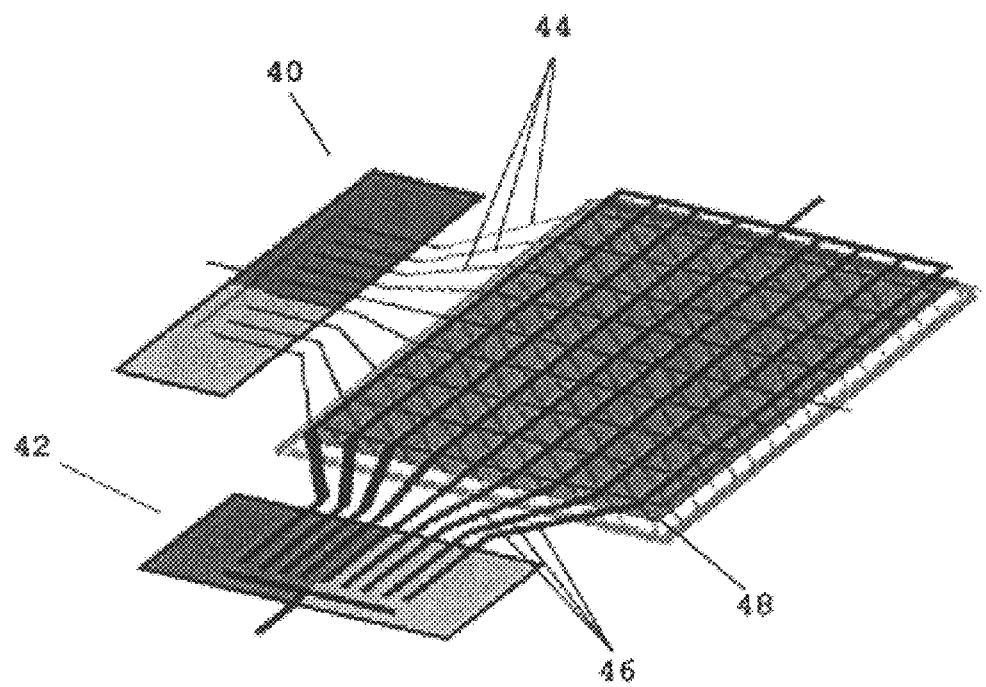
FIG. 5 is a partial isometric view of a magnetic memory device in accordance with the present invention, showing for an embodiment of the invention how controlled boundaries in thin films are created by using separated nanowires.
Figure 6:
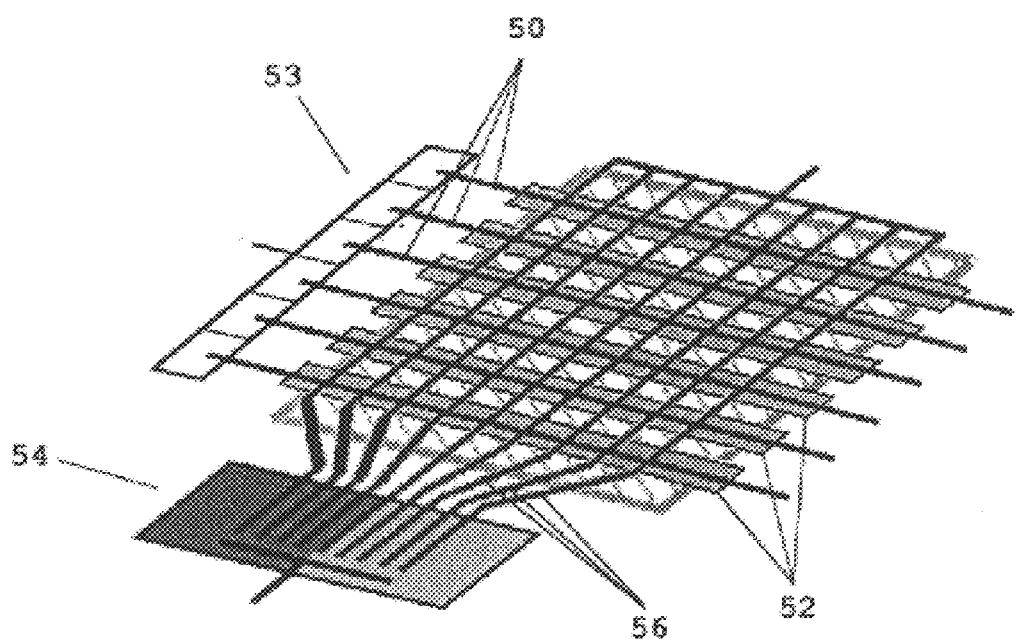
FIG. 6 is a partial isometric view of a magnetic memory device in accordance with the present invention, showing for an embodiment of the invention a hybrid structure.

The source-drain depletion zone asymmetry is of practical unimportance if a thin film conductor is used. Furthermore, this asymmetry can be fully suppressed by maintaining the same potential difference along the gate electrode (or between separate gates) as that between source and drain. In a MESFET, this correction is easy to implement. FIGS. 5 and 6 illustrate the controlled boundaries within thin films, as exhibited in embodiments of the invention. FIG. 5 uses a scheme whereby sweeping devices 40 and 42 are used to control the current in a set of orthogonal control wires 44 and 46, the intersections allow regions or portions of the magnetoresisitive element 48 to be sensitized. In this scenario a single magnetoresistive element, such as a thin MR film, may be used, although it will be evident to one of skill in the art that many such elements can be used at the same time to replace the single element. FIG. 6 is a hybrid design which utilizes a discrete switch device 53 to replace one of the sweeping devices. Both sets of control wires 50, 56 are wired or otherwise coupled to a set of magnetoresisitive elements 52. Sweeping one set of control wires 56 by means of a sweep device 54, in conjunction with switching 53 the other set of control wires 50 causes a set of data to be read or recorded.

B. Fluctuations of Depletion Zone Boundary

Of some interest is the overall stability of the shape of the depletion zone. This can be estimated by noise levels of existing FET devices. Johnson's noise does not matter in this case, since it is not caused by instability of depletion zone. The 1/f noise can also be ignored, because it is only evident at frequencies below hundreds of Hz, and this device will certainly operate at higher frequencies.

What matters most is not the noise itself, but the depletion zone boundary tailing. If we assume that these fluctuations have Gaussian distribution, we can separate the channel into N segments. Gauss' formula as applied to this case is:

$$\phi(Ir) = \frac{1}{\sum \cdot \sqrt{2 \cdot \pi}} \cdot e^{-\frac{(Ir-I)^2}{2\Sigma^2}} \quad \frac{\sigma}{i} = \frac{\sum}{I} \cdot \sqrt{N}$$

where Ir represents fluctuating current, φ(Ir)—probability density of random current values, I—average current in channel, Σ—root mean square deviation of current in channel, σ—root mean square deviation of current in segment, i—average current in segment.

If we now separate only the depletion zone surface into segments, and let Dz represent the width of this surface, and dz the width of each segment, then N=(Dz/dz)$^2$, and the relative value of the noise caused only by surface fluctuations σ/i=(Σ/I)·(Dz/dz). Physically, such noise could be caused by some imperfections of the junction.

There is also shot noise, occurring throughout the bulk of the conducting zone. If we now separate the volume into N segments homothetic to the original bulk shape: N=(Dz/dz)$^3$, then, for shot noise, σ/i=(Σ/I)·(Dz/dz)$^{3/2}$.

We can repeat the same steps for nanowires adjacent to channel surface. The depletion zone surface and then the channel volume are separated into N strips situated along the nanowires. The measurements of each strip are dz×Dz. For surface segments, N=Dz/dz, for volume segments N=N=(Dz/dz)$^2$.

TABLE 1

Calculated Depletion Zone Boundary Tailing

| Noise | Channel Surface | Adjacent Conductive Film Surface |
|---|---|---|
| Fluctuations of Depletion Zone Surface | $\frac{\sigma}{i} = \frac{\Sigma \cdot Dz}{I \cdot dz}$ | $\frac{\sigma}{i} = \frac{\Sigma}{I} \cdot \sqrt{\frac{Dz}{dz}}$ |
| Shot Noise | $\frac{\sigma}{i} = \frac{\Sigma}{I} \cdot \left(\frac{Dz}{dz}\right)^{\frac{3}{2}}$ | $\frac{\sigma}{i} = \frac{\Sigma \cdot Dz}{I \cdot dz}$ |

We can now estimate the minimal size of each segment dz, for which we can be reasonably certain whether current is passing though. As known for normal distribution, Ir is in the interval of I±3Σ with probability over 99%. We shall find such dz that i=3σ.

One way to estimate the boundary tailing is to proceed from an existing device with known dynamic range. For the purposes of this estimate, let us assume that the dynamic range of a certain FET limited by noise (not accounting for Johnson's and 1/f noise) in a given frequency band is 100 dB, and the channel is 100 μm wide. The channel width of the actual sweep FET does not matter in these calculations, as long as the fabrication method, channel height, purity of crystal, doping concentrations etc. are the same. In the worst case, if all that is shot noise, at channel surface dz=100 nm. At conductive film's surface, under the same conditions, dz≈3 nm. Accounting for inclination angle α, the boundary tailing will be d≈dz/sin(α).

IV. Static Magnetic Field Calculations

Figure 7:
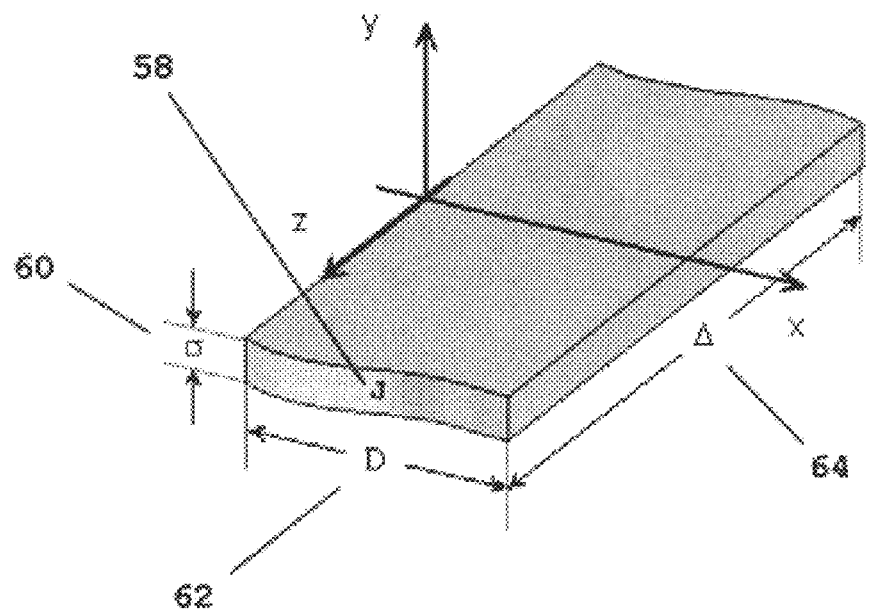
FIG. 7 is an isometric view illustrating the conductor model used for calculations.

FIG. 7 shows a conductor model used for the following calculations. The magnetic field outside the conductor of square section, via vector potential method can be written:

$$Hx(x, y, D) = \frac{-J}{4 \cdot \pi} \int_0^D \ln\left[\frac{\sqrt{4 \cdot [(x1-x)^2 + y^2] + \Delta^2} + \Delta}{\sqrt{4 \cdot [(x1-x)^2 + y^2] + \Delta^2} - \Delta} \cdot \frac{\sqrt{4[(x1-x)^2 + (\sigma+y)^2] + \Delta^2} - \Delta}{\sqrt{4[(x1-x)^2 + (\sigma+y)^2] + \Delta^2} + \Delta}\right] dx1 \quad (5a)$$

-continued $$Hy(x, y, D) = \frac{-J}{4 \cdot \pi} \int_0^\sigma \left[ \ln \left| \frac{\sqrt{4[(yl+y)^2+x^2]+\Delta^2}+\Delta}{\sqrt{4[(yl+y)^2+x^2]+\Delta^2}-\Delta} \right| \cdot \frac{\sqrt{4 \cdot [(D-x)^2+(yl+y)^2]+\Delta^2}-\Delta}{\sqrt{4 \cdot [(D-x)^2+(yl+y)^2]+\Delta^2}+\Delta} \right] dyl \quad (5b)$$

where J is current density 58 (current flows along the Z axis), σ—conductive film thickness 60 (y1=−σ...0), D—width of current-carrying zone 62 (x1=0 ... D), Δ—length 64 (z1=−Δ/2 ... Δ/2).

These formulas are written for z=0.

Figure 8:
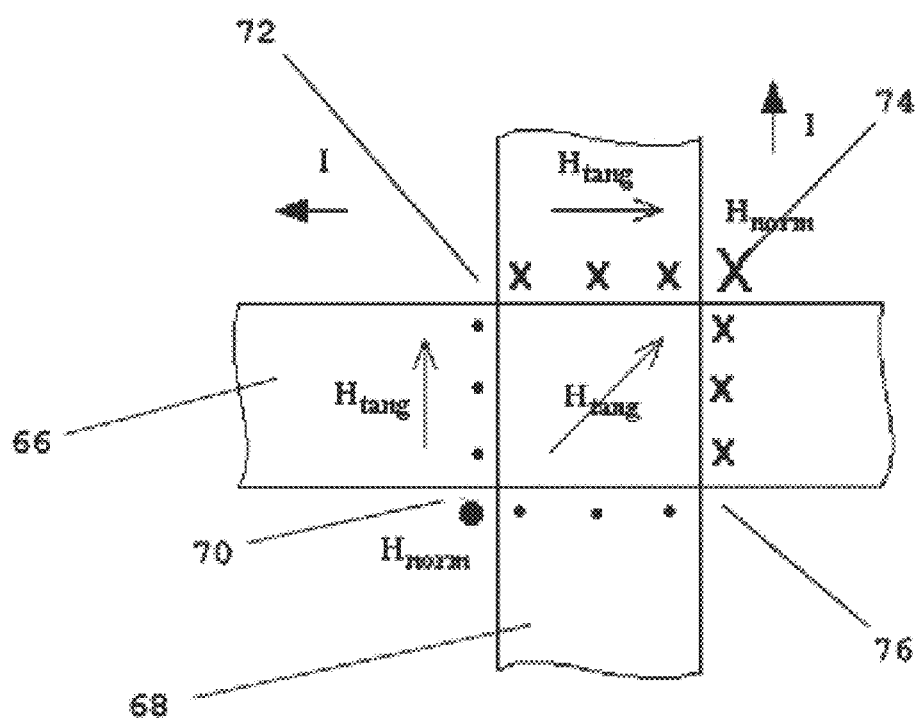
FIG. 8 is a plan view that shows directions of magnetic field generated by currents in two overlapping conductors.

First, we review the structure on FIG. 5, which can be represented by two orthogonally oriented and overlapping strips of conductive film 66, 68, as shown in FIG. 8. In this embodiment there are four points of intersection of current boundaries, 70,72,74,76 as shown in FIG. 8. At two points, situated at diagonally opposite vertices of a rectangle, the directions of normal components of magnetic fields are added, 70,74 and at the two remaining points 72,76 they are subtracted.

Away from the current boundaries, the perpendicular component is reduced to zero. Where the conductors overlap, the tangential component is greater by factor of √2 than that for each conductor.

Figure 9:
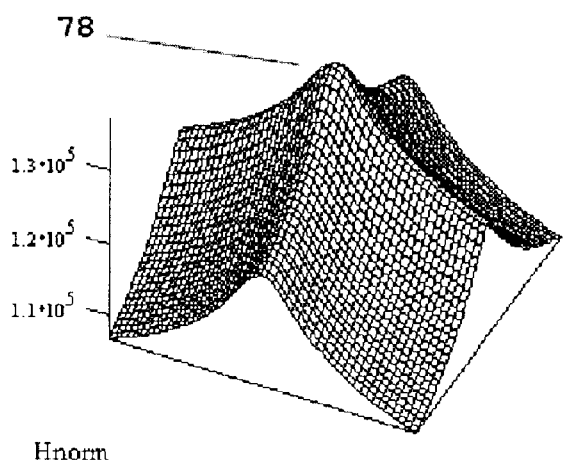
FIG. 9 is a topographic curve representing the field in the region of the intersecting edges of the overlapping conductors of FIG. 8.

FIG. 9 shows the intersecting current boundaries in an embodiment of the invention. The topographic curve in FIG. 9 corresponds to the region 70 of FIG. 8, with the apex 78 corresponding to the normal component of magnetization at the point 70, where normal components of the fields generated by respective conductors lie in the same direction. In this example 1 mm×1 mm×50 nm conductors are used. Current boundaries lie in the middle, as shown on FIG. 5. Current density is $10^8$ A/cm². An area of (1×1 μm around the intersection and 50 nm away from each conductor is shown.

Figure 10A:
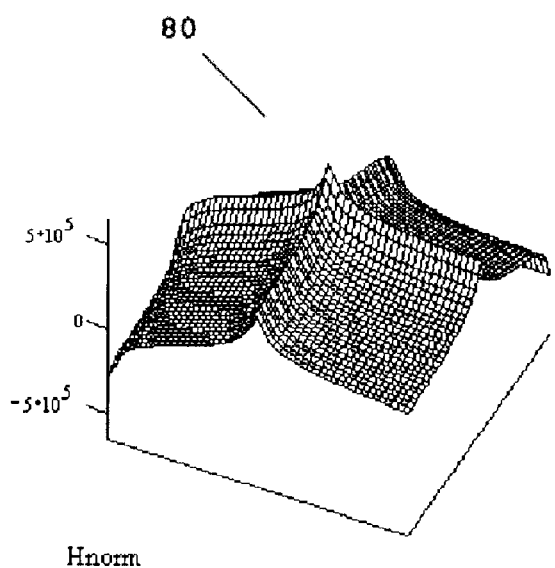
FIGS. 10a–10c are topographic curves representing the field in the region of the overlapping conductors of FIG. 8, specifically 10a) normal component, addition; 10b) tangential component; 10c) normal component, subtraction.
Figure 10B:
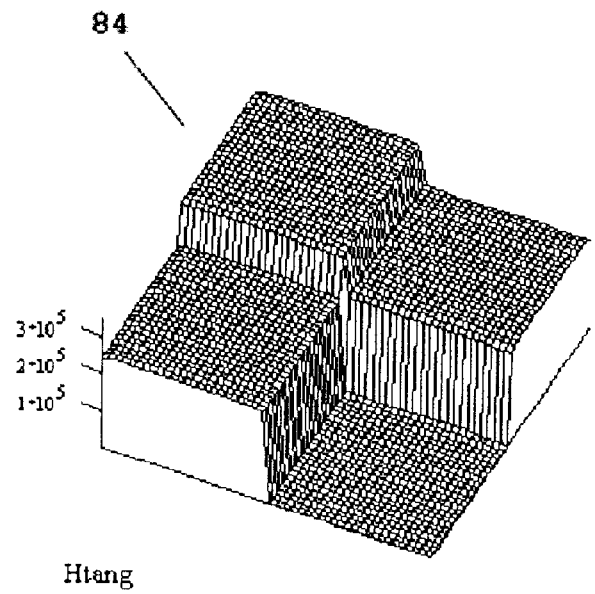
Figure 10C:
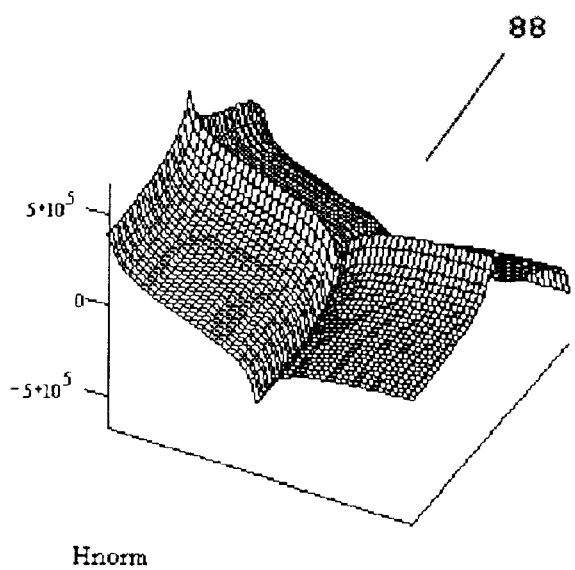

FIG. 10 shows a similar plot for 1 mm×1 mm×0.5 μm conductors. Current boundaries lie in the middle, as shown on FIG. 5. Current density $10^8$ A/cm². Full overlapping area 1×1 mm and 0.5 μm away from each conductor is shown. FIG. 10a shows the normal component, 80 with component addition; FIG. 10b shows the tangential component 84; FIG. 10c shows the normal component 88 with component subtraction.

Figure 11:
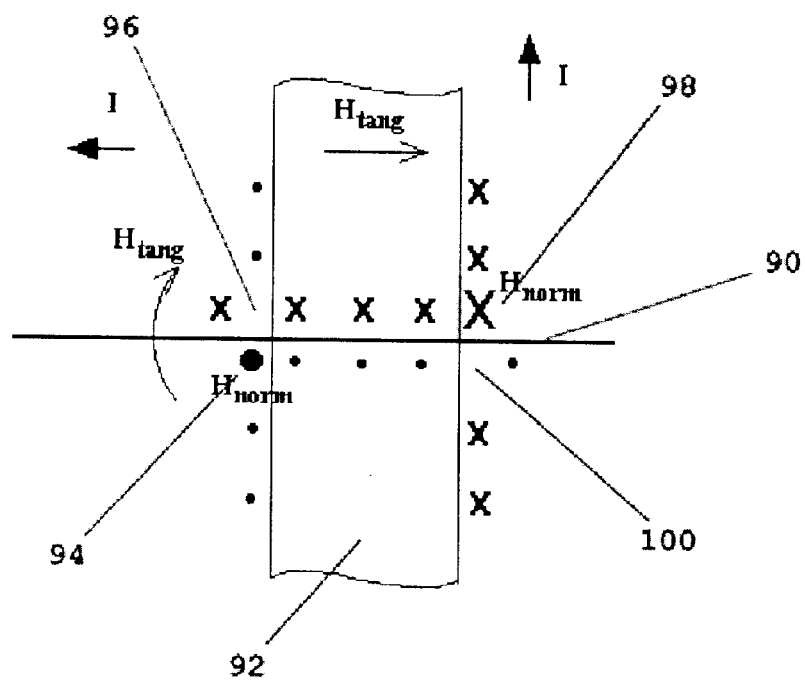
FIG. 11 is a plan view that shows for an embodiment of the invention a wire conductor and a strip of conductive film.

FIG. 11 shows a hybrid structure having a wire 90 and a strip of conductive film. 92 Here the situation is similar to that of FIG. 8, with four vertices, two subtracting 96, 100 and two adding, 94, 98, although obviously the transition is much sharper in this instance.

Figure 12A:
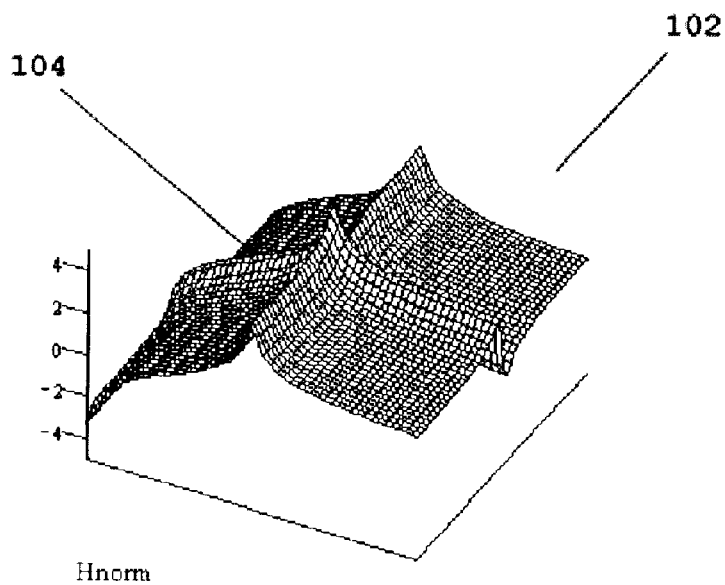
FIGS. 12a–12b are topographic curves showing for an embodiment of the invention the field curves for a hybrid structure.
Figure 12B:
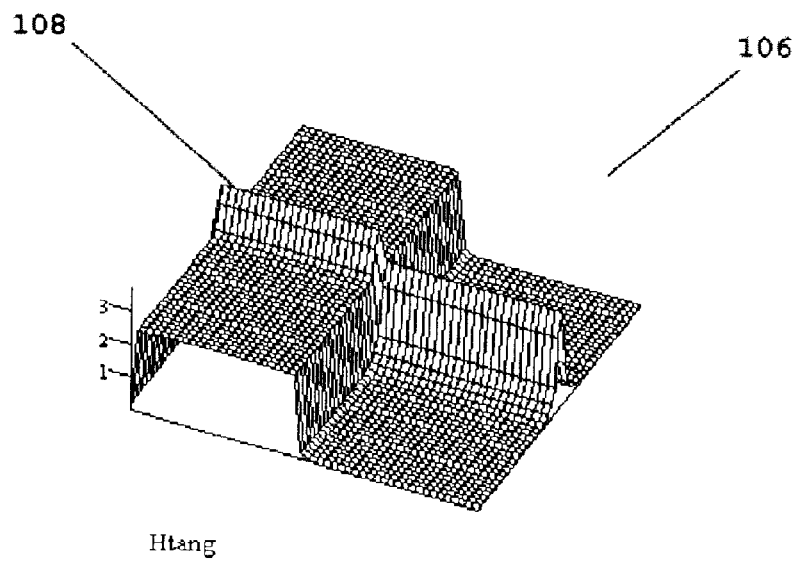

FIG. 12 shows the topographic curve 102 for the hybrid structure, clearly showing the sharp delineation at the location of the wire 104, FIG. 12b shows the tangential component of a hybrid structure.

The plots illustrated in FIGS. 9, 10 and 12 were created for current boundary situated in the middle of the channel, i.e. D=Δ/2; the H field transitions depend only slightly on D, because D<<Δ has the same effect as Δ=∞.

Figure 13:
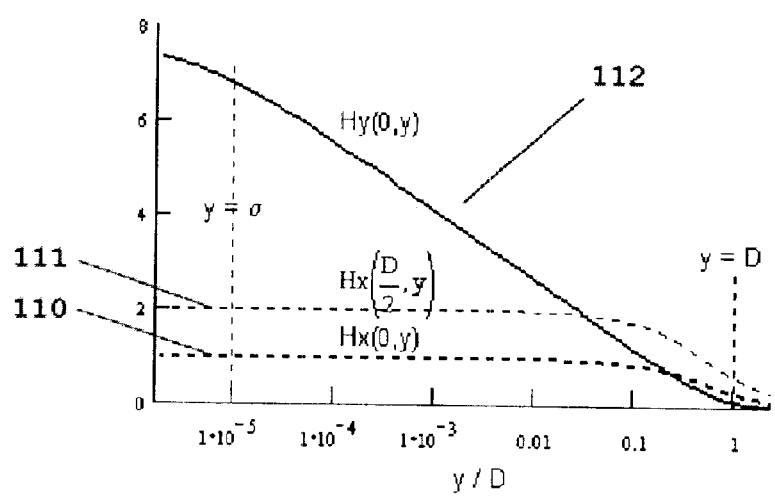
FIG. 13 is a graph that illustrates the comparative strengths of the tangential and normal negative fields as functions of spacing to conductive film.

FIG. 13 shows the comparative strengths of the normal components (for Hx(x=0) line 110; for Hx(x=D/2) line 111) and tangential components 112 as functions of spacing to conductive film.

The approximation for an infinitely long strip of film is:

$$Hx(x, y) = \frac{-J}{4 \cdot \pi} \cdot \int_0^D \ln \left[ \frac{(x-xl)^2+(\sigma+y)^2}{[(x-xl)^2+y^2]} \right] dxl \quad (5c)$$

$$Hy(x, y) = \frac{-J}{4 \cdot \pi} \cdot \int_0^\sigma \ln \left[ \frac{(D-x)^2+(y+yl)^2}{x^2(y+yl)^2} \right] dyl \quad (5d)$$

Further approximation for Hx with D→∞(or y<<D, σ<<D):

$$Hx(x=0, y>0)=-J \cdot \sigma/4$$

$$Hx(x=D/2, y>0)=-J \cdot \sigma/2 \quad (5e)$$

Further approximation for Hy with σ→0, y<<D, x<<D:

$$Hy(x, y) = \frac{-J \cdot \sigma}{4 \cdot \pi} \cdot \ln \left( \frac{x^2+y^2}{D^2} \right) \quad (5f)$$

The maximum slope of Hx(x) is at x=0. For longitudinal recording in thin medium, the transition length approximately equals the distance to the plane in the middle of the conductor parallel to its surface.

The Hy(x) slope is not as steep as the tangential slope. Therefore perpendicular recording resolution will be worse than tangential recording resolution, and it will depend on how critical the H/Hmax ratio is for a specific medium.

From (5f) it follows that the transition length is:

$$d = 2 \cdot \sqrt{\left( \frac{y}{D} \right)^{2 \cdot \frac{H}{Hmax}} - \left( \frac{y}{D} \right)^2} \quad (6)$$

Figure 14:
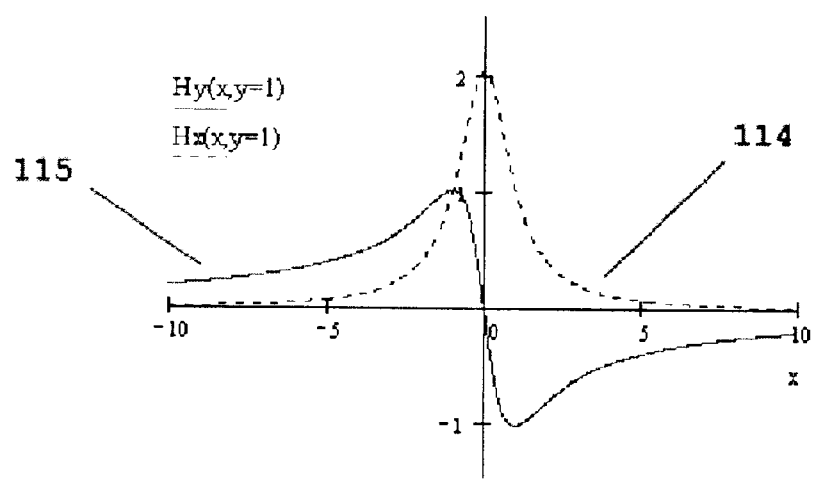
FIG. 14 is a graph that shows for an embodiment of the invention the signal resulting from a single wire conductor.

For the purposes of illustration, the magnetic field along the normal 114 and tangential 115 components of the infinitely long and infinitely thin wire (as shown in FIG. 14) is given by:

$$Hx(x, y) = \frac{1}{2 \cdot \pi} \cdot \frac{y}{y^2+x^2} \qquad Hy(x, y) = \frac{-1}{2 \cdot \pi} \cdot \frac{x}{y^2+x^2}$$

V. Storage Medium

When considering storage mediums for use with the invention, it will be evident that the track may be extremely narrow, less than 1 μm in width, if necessary.

The medium should ideally have low switching field distribution. The coercive force should not be too high because of the write current limitations, but higher than the demagnetizing field of the sensor. These conditions are not difficult to satisfy in practice.

Firstly, considering perpendicular recording. In principle, the Hnorm peak can record data at any chosen spot. The medium can be of two basic types:

(1) Particulate, in which the interaction between particles may be ignored. Here we will review single-domain behavior (the particles must not be too small, otherwise they become superparamagnetic).

Figure 15:
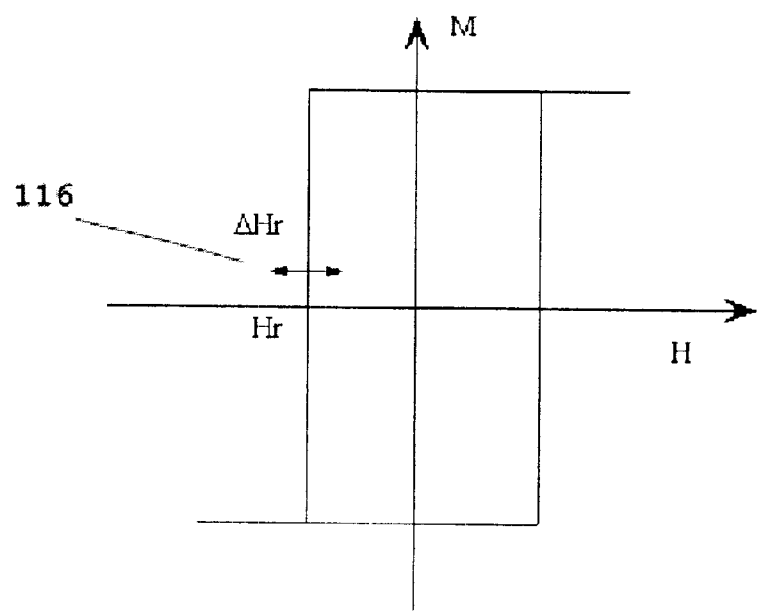
FIG. 15 is a diagram illustrating a hysteresis loop in the easy direction.

FIG. 15 shows a Hysteresis loop in the easy direction. ΔHr—switching field distribution 116 caused, for example, by variations in particle orientations.

Relative switching field distribution SFD=ΔHr/Hr.

In isotropic particles the coercive force equals zero, so the material must be anisotropic, be it due to particle shape, crystal properties, or deformation. In the easy direction, the hysteresis loop is a perfect rectangle, and in hard direction there is no hysteresis at all [5], [9]. Therefore, it is crucial that deviations in alignment of particles be as small as possible.

The tangential component of the recording field must be relatively small, otherwise irreversible magnetization will not occur. Conductive film edge satisfies this condition, but a single wire does not.

Given that the external field is created by two sources, both components are in the same direction, and the maximum strength of each is Hmax=Hr/2+ΔHr/4, condition for transition length d is $$\frac{H\left[x0 \pm \left(\frac{d}{2}\right)\right]}{Hmax} < \frac{2 - 3 \cdot SFD}{2 + SFD}$$

Figure 16:
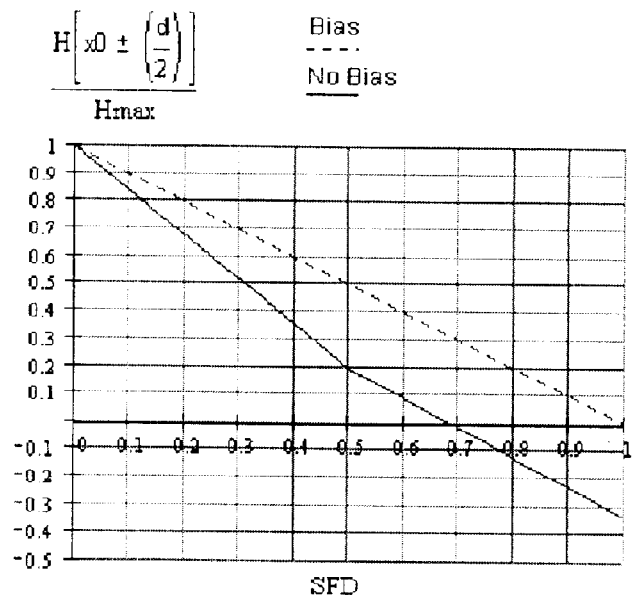
FIG. 16 is a chart illustrating the condition for transition length d.

(SFD=Switching Field Distribution). If a bias field Hbias<Hr ΔHr/2 is applied in the reverse direction, the recording will not suffer, and the transition length (as shown in FIG. 16) will be smaller. With bias, the condition then becomes:

$$\frac{H\left[x0 \pm \left(\frac{d}{2}\right)\right]}{Hmax} < 1 - SFD$$

(2) Solid film or strongly interacting particles. The material should possess strong uniaxial anisotropy with easy axis perpendicular to the film plane, otherwise the magnetization will be restricted to the film plane. When the film is magnetized in a perpendicular direction, strong opposite demagnetizing field prevents an avalanche of magnetization reversals. This allows for higher areal densities in perpendicular recording. In a large enough region the demagnetization has a negative feedback effect, shearing the hysteresis loop and increasing the coercive force. Therefore, coercive force in perpendicularly oriented film must be greater than that in a single domain particle of the same material. For example, according to experimental data in [5], Ms/Hc=3 . . . 5 in perpendicular media, 10 or greater in most longitudinal media.

According to fanning model of magnetization reversal [4], in single domain particles Hc≈Ms/4π (converted into SI), i.e. smaller than in film.

Figure 17:
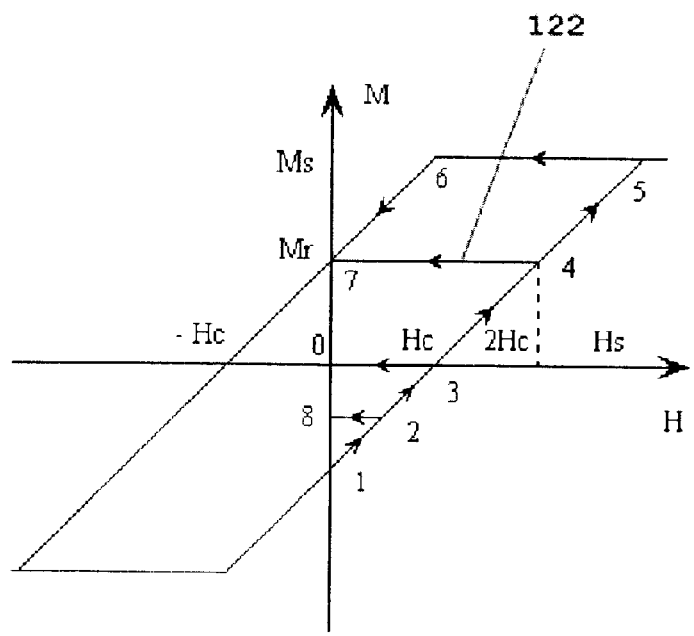
FIG. 17 is a diagram illustrating a typical hysteresis loop in a perpendicular film.

FIG. 17 shows a typical hysteresis loop in perpendicular film. Reversal field Hr≈2Hc, 122 dM/dH≈1 at H<|Hs|. Film is initially magnetized to—Mr. External field of strength H is turned on and off:

H < Hc:  1-2-8;         H = Hc:  1-3-0;

H = Hr:  1-4-7;         H > Hr:  1-5-6-7

Since in this loop some demagnetization still occurs even at small external field strengths, the condition H/Hmax<<1 must be satisfied.

This means that the Hnorm peak must have very steep slopes. The transition created by conductive film edge is, on the contrary, quite flat, as can be seen from formulas (5f) and (6). The resolution for such a hysteresis loop will be very low. The size d of area affected by Hnorm will be orders of magnitude higher than spacing y to the conductive film. Thus, the proposed sweep device is impractical for perpendicular recording in "solid" films. The hysteresis of a large area does not matter by itself, but the magnetization reversals that cause the hysteresis will destroy the recorded data.

From all these considerations, it may be seen that in-plane recording may preferably be used since it produces better results. The only disadvantage is that with sweep device, the recording cannot be done at any arbitrary point, since the horizontal component of the field created by conductive film has a boundary rather than a peak. The data can be recorded in blocks, as was discussed in Section II. In a hybrid structure, such as the one shown on FIG. 6 (Htang field plotted on FIG. 12b) there can be as many blocks as there are individual bit lines. The easy axis of the storage medium in this case should be oriented diagonally with respect to the bit lines. The areal density will mostly depend on the medium. The transition length of the recording field is of the same order of magnitude as the wire/film thickness and spacing to the medium. The Hnorm component, undesirable in this case, is largest near the edge of the conductive film. When it is higher than a certain critical value, only reversible magnetization will occur, assuming that the anisotropy axis of the medium is in plane. Therefore, no data will be erased or overwritten. The demagnetizing field will oppose Hnorm, and in ideal film will cancel it out. If, however, the resulting perpendicular component is non-zero, the data will be recorded where it is lower than the critical value. In the simplest model (coherent magnetization rotation), the critical angle between the easy axis and the external field is 45° [5], [9], i.e. horizontal and tangential components are equal. The transition length will depend on the switching field distribution. Given the perpendicular demagnetization component of the magnetic film, the transition length can be found by the same principle as in FIG. 16.

VI. Heat Abstraction

In this section, only in-plane recording will be considered. The write wire thickness and its spacing to the medium must be comparable to the desired transition length or smaller. In the simplest case, each write wire should produce Hx=Hr/√2.

In a theoretical situation for an infinitely thin and infinitely long wire, H=I/(2·π·r), where r is the distance. Therefore, the write current must be in the order of 2·π·σ·H [2], where σ is wire thickness. The wire's resistance R=ρ·D/σ² and dissipated power P≈t 4·π²·H²·ρ·D, where ρ is resistivity, D—length of wire. In this case, P does not depend on Given a conventional medium with Hr=30 kA/m, silver wire, P=0.3 w per 1 mm length. The current should only be switched on for recording of one block of data. The necessary current densities are in the order of $10^8$ A/cm². At this magnitude, the electron-migration effects are negligible [7], and the only problem is power dissipation.

For conductive film, from formula (5e), I=2·H·D. The resistance equals (ρ·L)/(σ·D), where L is length, and D—width of film strip. Spacing between nanowires is ignored. The maximum power, with current flowing through the complete width of the film, P=4·H²·ρ·D·L/σ. Factor (D/σ) approximately equals word resolution of the device. Therefore, the heat flow that must be abstracted is proportional to the areal density.

For example, consider the following design: 1 μm wide track corresponding to 1 bit wire, areal density 1 Mbit/mm² (quite modest by current standards). The maximum power will be 30 w/mm², average power 1 w/mm², or 15 w/Mbit, which is easily abstracted.

For readout operations, much weaker fields are needed, and so the power will mostly be used by the sensor(s)—as illustrated by formula 2.

With super conductive nanowires the power consumption during write operations would be limited to the scanning FET and/or the switching circuits. There is confirmed experimental evidence of ballistic electron transport in carbon nanotubes at room temperatures. Current densities in the order of $10^9$ A/cm$^2$ have been achieved with no heat produced [14]. Superconductive switching FET designs based on carbon nanotubes have been proposed.

VII. Signal Attenuation

The capacity and the resistance are distributed evenly over the film or wires carrying the write current as well as over the MR film. Since only small size devices are of interest, the inductance may be ignored. The film and the wires will act as a low-pass filter. It is preferable that the write current be uniform along the wires. To estimate the critical frequency, we shall find the attenuation factor per unit length.

The distribution factor for one section of infinite circuit is:

$$\alpha(\omega) = \exp\left[\frac{\sqrt{\left(\frac{R}{2}\right)^2 - i \cdot \frac{R}{\omega \cdot C}} - \frac{R}{2}}{\sqrt{\left(\frac{R}{2}\right)^2 - i \cdot \frac{R}{\omega \cdot C}} + \frac{R}{2}}\right]$$

and for an infinite number of sections:

$$\alpha(\omega) = \exp\left[-i \cdot \omega \cdot C \cdot \sqrt{-i \cdot \frac{R}{(\omega \cdot C)}}\right]$$

where R, C are resistance and capacity per unit length, respectively.

The attenuation factor is given by:

$$|\alpha(\omega)| = \exp\left(-\sqrt{\frac{R \cdot \omega \cdot C}{2}}\right)$$

and the time constant:

$$R \cdot C = \frac{\varepsilon \cdot \varepsilon 0 \cdot \rho \cdot L^2}{\lambda \cdot \sigma}$$

where $\in 0$ is dielectric constant, $\in$—relative permittivity, $\lambda$—spacing between conductive film and ground, $\sigma$—thickness of conductive film, and L—length of structure.

Figure 18:
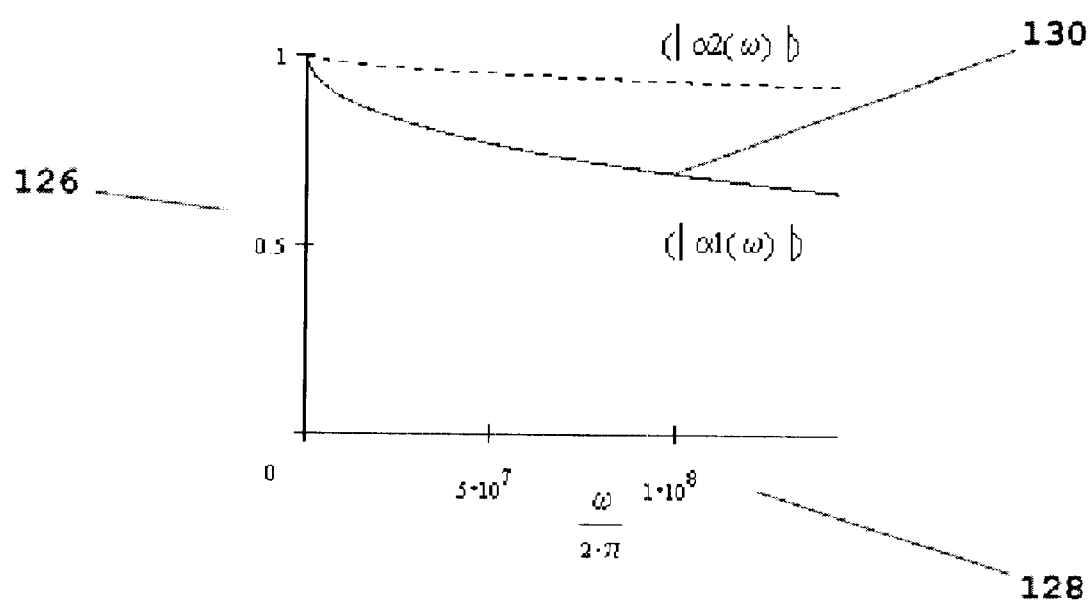
FIG. 18 is a graph that shows an example of attenuation over a length of permalloy film.

FIG. 18 shows an example of the attenuation with frequency 128 over 1 mm length of 400 Å permalloy film, at 100 nm distance to the ideal ground. The relative permittivity of insulator equals 1. For $|\alpha 1|$ Attenuation 130 at 100 MHz is approximately 0.7 per 1 mm. $|\alpha 2|$ same, for 100 nm thick silver film. Attenuation at 100 MHz is 0.9 per 1 mm length s.

INDUSTRIAL APPLICABILITY

As described embodiments of the invention include controlled MR sensor devices and sweep FET devices. Preliminary calculations show that an integrated MRAM device can be built based on these inventions with materials currently used for magnetic data storage. One likely disadvantage intrinsic to the proposed sweep device is higher total power consumption. However, in contrast to the switching circuitry of spin valve and pseudo spin valve cells, the power is dissipated over a relatively large area. The main advantages of both the controlled sensor and the sweep device are high design flexibility and potentially higher speed and data density compared to existing technologies.

Other features, aspects and objects of the invention can be obtained from a review of the figures and the claims. It is to be understood that other embodiments of the invention can be developed and fall within the spirit and scope of the invention and claims.

What is claimed is:

1. A data storage system for the storage and retrieval of data information, comprising:
    a magnetic storage medium for storage of data;
    a magnetosensitive sensor, proximate to said magnetic storage medium;
    means for generating a spatially distributed control field within said magnetosensitive sensor to create a selected region having varied magnetic sensitivity; and,
    means for detecting a change in the properties of said magnetosensitive sensor to read the data stored by said magnetic storage medium.

2. The data storage system of claim 1, wherein said magnetosensitive sensor and said magnetic storage medium are in fixed positions with respect to one another.

3. The data storage system of claim 1, wherein said magnetosensitive sensor includes a magnetosensitive film, and further wherein said means for generating a spatially distributed control field includes a plurality of electrically conductive control wires, spatially distributed within a plane parallel to or coincident with the plane of said magnetosensitive film, whereupon a passing of an electric current through a set of said control wires generates a magnetic field in the vicinity of said set of control wires and changes the magnetic sensitivity of a corresponding region of said magnetosensitive film.

4. The data storage system of claim 3, wherein said means for generating includes a control circuit for selecting a set of said control wires through which to pass electric current.

5. The data storage system of claim 4, wherein the selected region of varied sensitivity may be moved within the magnetoresistive sensor by successively selecting different sets of control wires through which to pass electric current.

6. The data storage system of claim 1, wherein said selected region corresponds to a single data storage location of the storage medium.

7. The data storage system of claim 3, wherein said plurality of control wires forms a two-dimensional matrix of substantially orthogonal wires, wherein the portion of magnetosensitive film to be desensitized is selected by passing a current through a set of two or more control wires, including at least one wire in each direction of said matrix.

8. The data storage system of claim 7, wherein the selected region may be moved within the magnetoresistive sensor by successively activating a different set of said plurality of control wires.

9. The data storage system of claim 4, wherein said control circuit includes a field effect transistor for controlling the current in at least a subset of said control wires.

10. The data storage system of claim 3, wherein said control wires comprise a conductive film having a plurality of discrete conductive nanowires.

11. The data storage system of claim 1, wherein said magnetosensitive sensor is a magnetoresistive sensor and said means for detecting includes a circuit for detecting a change in the electrical resistance of said magnetoresistive sensor.

12. A method of reading data stored on a data storage medium, comprising the steps of:
    (A) locating a magnetosensitive sensor proximate to a magnetic storage medium having stored data in the form of a spatially distributed magnetic field;

(B) generating a spatially distributed control field within the magnetosensitive sensor to change the sensitivity of a region of the magnetosensitive sensor to the magnetic field on said magnetic storage medium; and, (C) detecting a change in the properties of said magnetosensitive sensor to read the data stored on a corresponding region of the magnetic storage medium, in response to changing the sensitivity of the region to the magnetic field on the magnetic storage medium.

13. The method of claim 12, wherein said step of locating includes fixing portions of said magnetoresistive sensor and said magnetic storage medium with respect to one another.

14. The method of claim 12, wherein said magnetosensitive sensor includes a magnetosensitive film, and further includes a plurality of electrically conductive control wires, spatially distributed within a plane parallel to or coincident with said magnetosensitive film, whereupon a passing of an electric current through a set of said control wires generates a magnetic field in the vicinity of said set of control wires and changes the magnetic sensitivity of a corresponding region of said magnetosensitive film.

15. The method of claim 14, wherein said step of generating includes selecting a set of said control wires through which to pass electric current.

16. The method of claim 12, further comprising moving the selected region of changed sensitivity within the magnetoresistive sensor by successively selecting different sets of control wires through which to pass electric current.

17. The method of claim 12, wherein said selected region corresponds to a single data storage location of the storage medium.

18. The method of claim 14, wherein said magnetosensitive sensor includes a two-dimensional matrix of substantially orthogonal control wires, and wherein said step of generating a control field to sensitize a portion of magnetosensitive film includes passing a current through a set of two or more control wires, including at least one wire in each direction of said matrix.

19. The method of claim 18, wherein the selected region may be moved within the magnetoresistive sensor by successively activating a different set of said plurality of control wires.

20. The method of claim 15, wherein said wherein said control wires are selected by coupling a field effect transistor to said control wires to control the current therein.

21. The method of claim 14, wherein said control wires comprise a conductive film having a plurality of discrete conductive nanowires.

22. The method of claim 12, wherein said magnetosensitive sensor is a magnetoresistive sensor and said means for detecting includes a circuit for detecting a change in the electrical resistance of said magnetoresistive sensor.

23. A data storage system for the storage and retrieval of data information, comprising:
a magnetic storage medium for storing data in a plurality of data storage regions;
a magnetoresistive sensor, proximate to, and fixed in position with respect to, said magnetic storage medium, said magnetoresistive sensor including
a magnetoresistive film having an electrical resistance which varies upon application of an external magnetic field, and,
a plurality of electrically conductive control wires, spatially distributed within a plane parallel to or coincident with the plane of said magnetoresistive film;
a control circuit for passing electric current through a selected set of said control wires, to vary the sensitivity of a selected region of said magnetoresistive film corresponding to a data storage region of said magnetic storage medium; and,
a readout circuit for determining the resistance of said magnetoresistive film corresponding to data stored on said data storage medium in a region corresponding to said selected region.

24. The data storage system of claim 23, wherein the selected region of changed sensitivity may be moved within the magnetoresistive sensor by successively selecting different sets of control wires through which to pass electric current.

25. The data storage system of claim 23, wherein said selected region corresponds to a single data storage location of the storage medium.

26. The data storage system of claim 23, wherein said plurality of control wires forms a two-dimensional matrix of substantially orthogonal wires, wherein the portion of magnetoresistive film to be desensitized is selected by passing a current through a set of two or more control wires, including at least one wire in each direction of said matrix.

27. The data storage system of claim 23, wherein the selected region may be moved within the magnetoresistive sensor by successively activating a different set of said plurality of control wires.

28. The data storage system of claim 23, wherein said control circuit includes a field effect transistor for controlling the current in said control wires.

29. The data storage system of claim 23, wherein said control wires comprise a conductive film having a plurality of discrete conductive nanowires.

30. A method of reading data stored on a data storage medium, comprising the steps of:
(A) locating a magnetoresistive sensor proximate to, and fixed in space with respect to, a magnetic storage medium having stored data in the form of a spatially distributed magnetic field, the magnetoresistive sensor including a magnetoresistive film, and a plurality of electrically conductive control wires, spatially distributed within a plane parallel to or coincident with the plane of said magnetoresistive film;
(B) passing electric current through a selected set of control wires to generate a spatially distributed control field within said magnetoresistive sensor to change the sensitivity of a region of said magnetoresistive sensor to the magnetic field on said magnetic storage medium; and,
(C) detecting a change in the properties of said magnetoresistive sensor and hence the data stored on a corresponding region of the magnetic storage medium, in response to changing the sensitivity of said region to the magnetic field on said magnetic storage medium.

31. The method of claim 30 further comprising moving the selected region of changed sensitivity within the magnetoresistive sensor by successively selecting different sets of control wires through which to pass electric current.

32. The method of claim 30 wherein said selected region corresponds to a single data storage location of the storage medium.

33. The method of claim 30 wherein said magnetoresistive sensor includes a two-dimensional matrix of substantially orthogonal control wires, and wherein said step of generating a control field to sensitize a portion of magnetoresistive film includes passing a current through a set of two or more control wires, including at least one wire in each direction of said matrix.

34. The method of claim 30 wherein said step of detecting includes using a field effect transistor to control the current in at least a subset of said control wires.

35. The method of claim 30 wherein said control wires comprise a conductive film having a plurality of discrete conductive nanowires.

36. The data storage system of claim 9 wherein said subset of control wires are activated in a sweeping manner to form a word line, by electrically coupling said field effect transistor device to said subset of control wires.

37. The data storage system of claim 36 wherein said field effect transistor is coupled to the word line conductors at a sweep zone on the field effect transistor by connecting the lateral face of the field effect transistor channel to the word line conductors.

38. The data storage system of claim 37 wherein the channel of said field effect transistor is oriented at an angle to widen the sweep zone over which the conductors may be connected.

39. The data storage system of claim 37 wherein the doping concentration within the channel of said field effect transistor is gradually varied across the channel width to widen the sweep zone over which the conductors may be connected.

40. The data storage system of claim 37 wherein a voltage is applied across gate electrode of said field effect transistor to cause the depletion zone within the field effect transistor channel to be gradually varied across the channel width and to widen the sweep zone over which the conductors may be connected.

41. The data storage system of claim 28 wherein said subset of control wires are activated in a sweeping manner to form a word line, by electrically coupling said field effect transistor device to said subset of control wires.

42. The data storage system of claim 41 wherein said field effect transistor is coupled to the word line conductors at a sweep zone on the field effect transistor by connecting the lateral face of the field effect transistor channel to the word line conductors.

43. The data storage system of claim 42 wherein the channel of said field effect transistor is oriented at an angle to widen the sweep zone over which the conductors may be connected.

44. The data storage system of claim 42 wherein the doping concentration within the channel of said field effect transistor is gradually varied across the channel width to widen the sweep zone over which the conductors may be connected.

45. The data storage system of claim 42 wherein a voltage is applied across the gate electrode of said field effect transistor to cause the depletion zone within the field effect transistor channel to be gradually varied across the channel width and to widen the sweep zone over which the conductors may be connected.

* * * * *